(12) United States Patent
Matsui

(10) Patent No.: US 6,268,773 B1
(45) Date of Patent: Jul. 31, 2001

(54) POWER SYSTEM

(75) Inventor: Takahiro Matsui, Tokyo (JP)

(73) Assignee: Wellpine Communications Co., Ltd., Tokyo (JP)

( * ) Notice: Subject to any disclaimer, the term of this patent is extended or adjusted under 35 U.S.C. 154(b) by 0 days.

(21) Appl. No.: 09/508,853

(22) PCT Filed: Oct. 30, 1997

(86) PCT No.: PCT/JP97/03943
§ 371 Date: Mar. 17, 2000
§ 102(e) Date: Mar. 17, 2000

(87) PCT Pub. No.: WO99/17417
PCT Pub. Date: Apr. 8, 1999

(30) Foreign Application Priority Data

Sep. 26, 1997 (JP) .................................... 9-279587

(51) Int. Cl.⁷ .............................. H03F 3/04; H03F 21/00
(52) U.S. Cl. ..................... 330/297; 381/94.5; 381/120; 330/51
(58) Field of Search .................... 330/51, 297; 381/94.5, 381/120

(56) References Cited

U.S. PATENT DOCUMENTS

| | | | |
|---|---|---|---|
| 5,546,051 | * | 8/1996 | Koizumi et al. ................. 330/297 |
| 5,898,342 | * | 4/1999 | Bell ............................... 330/297 |
| 6,163,706 | * | 12/2000 | Rozenblit et al. ................. 330/297 |

FOREIGN PATENT DOCUMENTS 62-277806 * 2/1987 (JP) ..................................... 330/297

* cited by examiner

Primary Examiner—Michael B Shingleton
(74) Attorney, Agent, or Firm—Kanesaka & Takeuchi

(57) ABSTRACT

A power system the size of which does not become very large although the system uses secondary batteries, and in which the supply of DC power is not stopped at the time of charging the battery after the secondary battery is completely discharged, and an amplification system for audio using the power system. When no signal is inputted to an amplifier (1) for audio for a fixed period of time or longer, a control circuit (4) gives a connection switching signal (b) to a connection switching circuit (7) under a fixed condition, but, Whenever the signal (b) is given to the circuit (7), one of the secondary batteries (6A and 6B) is switched to the power source of the amplifier (1) from a state where the battery is charged by means of a charging circuit (8), and the other battery is switched to a state where the battery is charged by means of the circuit (8) from a state where the battery supplies electric power to the amplifier (1).

6 Claims, 2 Drawing Sheets

POWER SYSTEM

TECHNICAL FIELD

This invention relates to a power system or the like which supplies DC power to an electronic appliance into which contamination of noises from outside should be avoided as much as possible as in an amplifier for audio.

BACKGROUND ART

Conventionally, as a power system which supplies DC power to an electronic appliance such as an amplifier for audio which dislikes contamination of noises from outside, there was used such a system that, after accepting the supply of alternate power, which would be rectified, obtained a power in the shape of rectified wave, and obtained a direct current with ripples as little as possible by means of a smoothing capacitor, a ripple filter circuit, and a stabilizing circuit, etc., and outputted this.

However, even if the above described power system was used, any DC power completely without ripples was not obtainable, and in the case when such a DC power was supplied to the above described amplifier for audio, noise (hum) due to the ripples was generated by the amplifier for audio.

Taking the above described background into consideration, in recent years, amplifiers for audio, etc., which are supplied with power from batteries (that is secondary batteries) with huge capacities, have been proposed, and some have already been introduced for practical use.

However, an amplifier for audio, etc., powered by a battery with a huge capacity, which is large in size, is inconvenient in terms of transportability and installation, and in addition when the battery is discharged and the supply of power has been stopped, it will become necessary for the battery to be charged over a comparatively long hours, and during the period the amplifier for audio, and moreover, any audio equipment itself will not become unusable.

The present invention has been accomplished, by contemplating the above described backgrounds, and the purpose thereof is to provide a power system or the like which does not become very large in terms of size, and in addition does not halt any supply of DC power due to charging after discharge.

DISCLOSURE OF THE INVENTION

In a first invention, a power system to supply an electronic appliance with a DC power is configured as follows. That is, such a configuration comprises:

a plurality of secondary batteries;

a detecting circuit on absence of signal which detects whether or not there is any input signal into the above described electronic appliance, and in the case when there is no above described input signal continuously for a predetermined fixed time period, sends out a detecting signal on absence of signal to indicate such a state;

a charging circuit which, after receiving the supply of an alternate power, implements the supply of DC power for charging;

a connection switching circuit which connects one of a plurality of the secondary batteries with the above described electronic appliance so that the battery functions a secondary battery for the supply of power to supply the electronic appliance with a DC power, and connects the others with the above described charging circuit so as to function as secondary batteries to be charged, and every time when a detecting signal on absence of a signal is sent out from the detecting circuit on absence of a signal, switches connection status, and causes the one which functioned as the secondary battery for the supply of power up to the point of time to function as the secondary battery to be charged, and causes one of those batteries which functioned the secondary battery to be charged up to the point of time to function as the secondary battery for the supply of power.

The above described configuration makes such a power system obtainable that does not become very large in terms of sizes, and in addition, for charging the battery after the time when the secondary battery on duty is completely discharged, will not halt the supply of DC power to the above described electronic appliance.

In the second invention, a power system to supply an electronic appliance with a DC power is configured as follows. That is, such a configuration comprises:

a plurality of secondary batteries;

a detecting circuit on absence of signal which, after a predetermined time has lapsed since switching in connection status in the later-described connection switching circuit has taken place, starts detecting whether or not there is any input signal into the above described electronic appliance, and in the case when there is no above described input signal continuously for a predetermined fixed time period, sends out a detecting signal on absence of signal to indicate such a state;

a charging circuit which, after receiving the supply of an alternate power, implements the supply of DC power for charging; and a connection switching circuit which connects one of a plurality of said secondary batteries with the above described electronic appliance so that the battery functions a secondary battery for the supply of power to supply the electronic appliance with a DC power, and connects the others with the above described charging circuit so as to function as secondary batteries to be charged, and every time when a detecting signal on absence of a signal is sent out from the detecting circuit on absence of a signal, switches connection status, and causes the one which functioned as the secondary battery for the supply of power up to the point of time to function as the secondary battery to be charged, and causes one of those batteries which functioned the secondary battery to be charged up to the point of time to function as the secondary battery for the supply of power.

The above described configuration makes such a power system obtainable that does not become very large in terms of sizes, and in addition, for charging the battery after the time when the secondary battery on duty is completely discharged, will not halt the supply of DC power to the above described electronic appliance.

In the third invention, a power system to supply an amplifier for audio with a DC power is configured as follows.

That is, such a configuration comprises:

a plurality of secondary batteries;

a detecting circuit on absence of signal which, after a predetermined time has lapsed since switching in connection status in the later-described connection switching circuit has taken place, starts detecting whether or not there is any audio input signal into the above described amplifier for audio, and in the case when there is no the audio input signal continuously for a predetermined fixed time period, sends out a detecting signal on absence of signal to indicate such a state;

a charging circuit which, after receiving an alternate power, implements the supply of DC power for charging; and a connection switching circuit which connects one of a plurality of said secondary batteries with the above described amplifier for audio so that the battery functions a secondary battery for the supply of power to supply the amplifier for audio with a DC power, and connects the others with the above described charging circuit so as to function as batteries to be charged, and every time when a detecting signal on absence of a signal is sent out from the detecting circuit on absence of a signal, switches connection status, and causes the one which functioned as the secondary battery for the supply of power up to the point of time to function as the secondary battery to be charged, and causes one of those batteries which functioned the secondary battery to be charged up to the point of time to function as the secondary battery for the supply of power.

The above described configuration makes such a power system obtainable that does not become very large in terms of sizes, and in addition, for charging the battery after the time when the secondary battery on duty is completely discharged, will not halt the supply of DC power to the above described amplifier for audio.

The fourth invention is configured so that the number of the secondary battery in the power system in the above described first through third inventions is two.

In the fifth invention, an amplification system for audio has been configured as follows.

That is, such a configuration comprises:

the power system according to the above described third invention;

an amplifier for audio which is provided with the power supply by said power system; and a mute circuit to temporarily mute an output from the above described amplifier for audio at the time when switching in connection status by a connection switching circuit of the power system takes place.

Such a configuration serves to result in making obtainable not only the above described effect due to usage of the above described power system, but also such an effect that any occurrence of uncomfortable switching noises from speakers originated in switching in connection status by the above described connection switching circuit becomes avoidable.

The sixth invention is configured so that the number of the secondary battery in the power system in the amplification system for audio according to the fifth invention is two.

BEST MODE FOR CARRYING OUT THE INVENTION

In order to explain and describe the present invention in further detail, description hereon will be proceeded with reference to the attached drawings.

Figure 1:
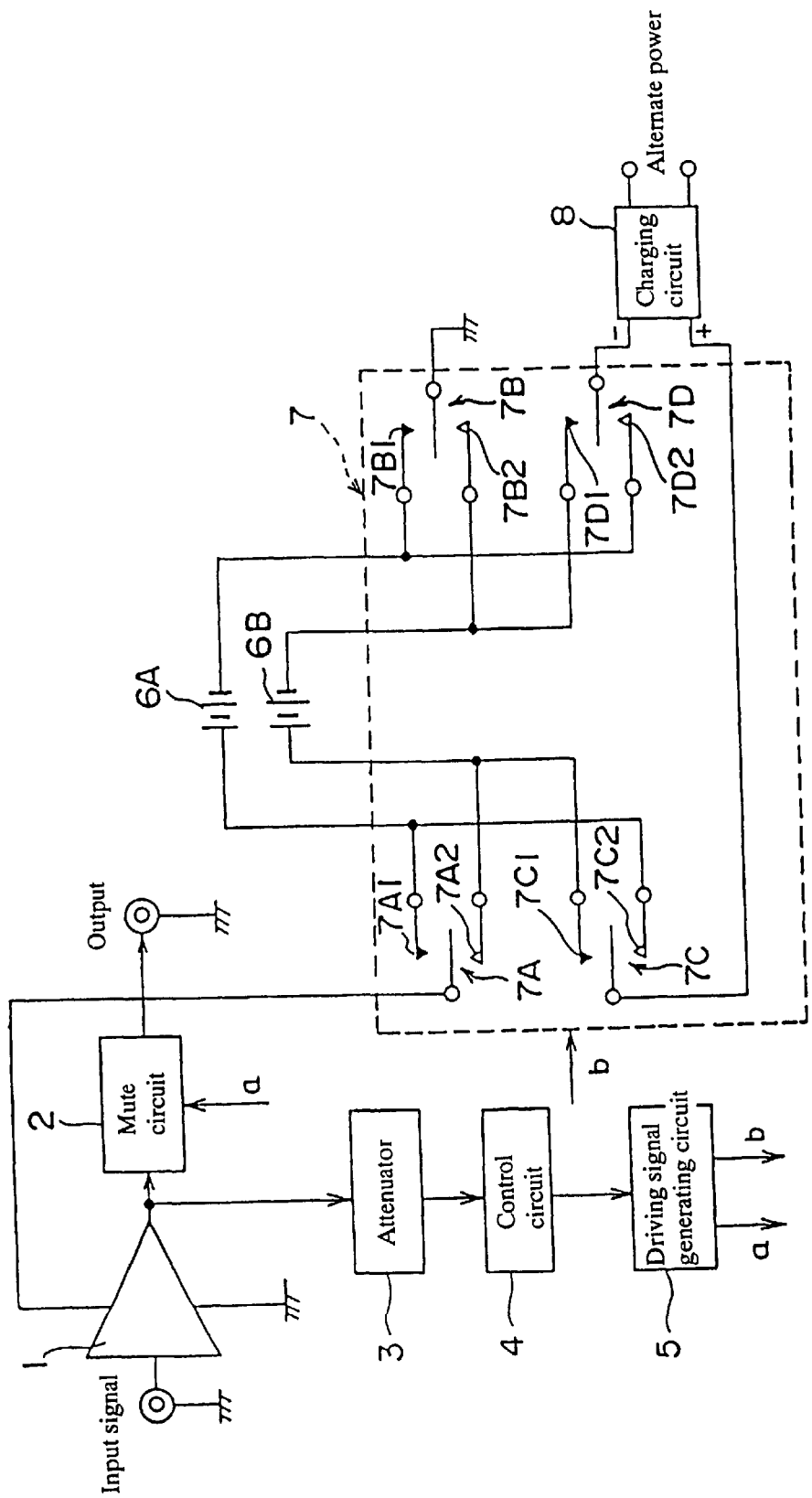
FIG. 1 is a circuit diagram showing a circuit configuration of a preferred power system of the present invention and an amplification system for audio inclusive thereof in a built-in fashion.

FIG. 1 is a circuit diagram showing a circuit configuration of a preferred power system of the present invention and an amplification system for audio inclusive thereof in a built-in fashion. In the drawing, an amplifier for audio 1 is an amplifier which receives an audio signal as an input signal and amplifies this at a predetermined amplifying ratio for outputting. A mute circuit 2 is at ordinary time, a circuit portion to which an output of the above described amplifier for audio 1 is inputted, and which sends this to a circuit portion of the subsequent step, and in addition, at the time when a mute instruction signal "a" has been sent in from a driving signal generating circuit 5 described later, mutes the above described input.

An attenuator 3 is a circuit portion to which the output from the amplifier for audio 1 is inputted, and which attenuates the level thereof to a predetermined value and sends it out. A control circuit 4 is a circuit portion to which the signal sent from the above described attenuator 3 (that is, the one obtained by attenuating the output from the amplifier for audio 1) is inputted, and which, as of the time when a predetermined time period has lapsed subject to a switching operation of a connection switching circuit 7 described later, looks into whether or not the audio signal is included in the output of this amplifier for audio 1, and if the audio electric signal is not included there continuously over a fixed time period, sends a signal to indicate such a state to the driving signal generating circuit 5. The driving signal generating circuit 5 is a circuit portion which receives the above described signal, and sends out a mute instructing signal "a" to the mute circuit 2, and immediately afterwards sends a connection switching signal "b" to the connection switching circuit 7.

The connection switching circuit 7 is a circuit portion, which comprises four relays 7A, 7B, 7C, and 7D, and connects either secondary battery 6A or 6B with a charging circuit 8 for charging and connects the other thereof with the amplifier for audio 1 for implementing the supply of DC power to the amplifier for audio 1 and, then receiving the connection switching signal "b" from the driving signal generating circuit 5, causes the party which has been supplying the amplifier for audio 1 with a power so far to undergo charging with the charging circuit 8, and causes the party which has been undergoing charging with the charging circuit 8 so far to be connected with the amplifier for audio 1 so as to cause it to supply the amplifier for audio 1 with power. That is, each time the connection switching signal "b" is sent in, moving contacts of the above described respective relays switch from the state under which the moving contacts are respectively in contact with fixed contacts 7A1, 7B1, 7C1, and 7D1 (the fixed contacts symbolized by black triangles in the drawing) to the state under which the moving contacts are respectively in contact with fixed contacts 7A2, 7B2, 7C2, and 7D2 (the fixed contacts symbolized by white triangles in the drawing), or in backward direction from the state under which the moving contacts are respectively in contact with fixed contacts 7A2, 7B2, 7C2, and 7D2 to the state under which the moving contacts are respectively in contact with fixed contacts 7A1, 7B1, 7C1, and 7D1. Incidentally, the moving contacts of the relays 7A and 7B are respectively in contact with the power terminal of the amplifier for audio land with the earth, and the moving contacts of the relays 7C and 7D are respectively in contact with the positive and negative output terminals of the charging circuit 8.

The secondary batteries 6A and 6B have approximately the same charging-discharging features, and compared with the batteries described in the conventional example, are smaller in terms of capacity as well as size. The charging circuit 8 is a circuit portion to which an alternate power is given and which performs its rectifying operation or the like to send it out.

Figure 2:
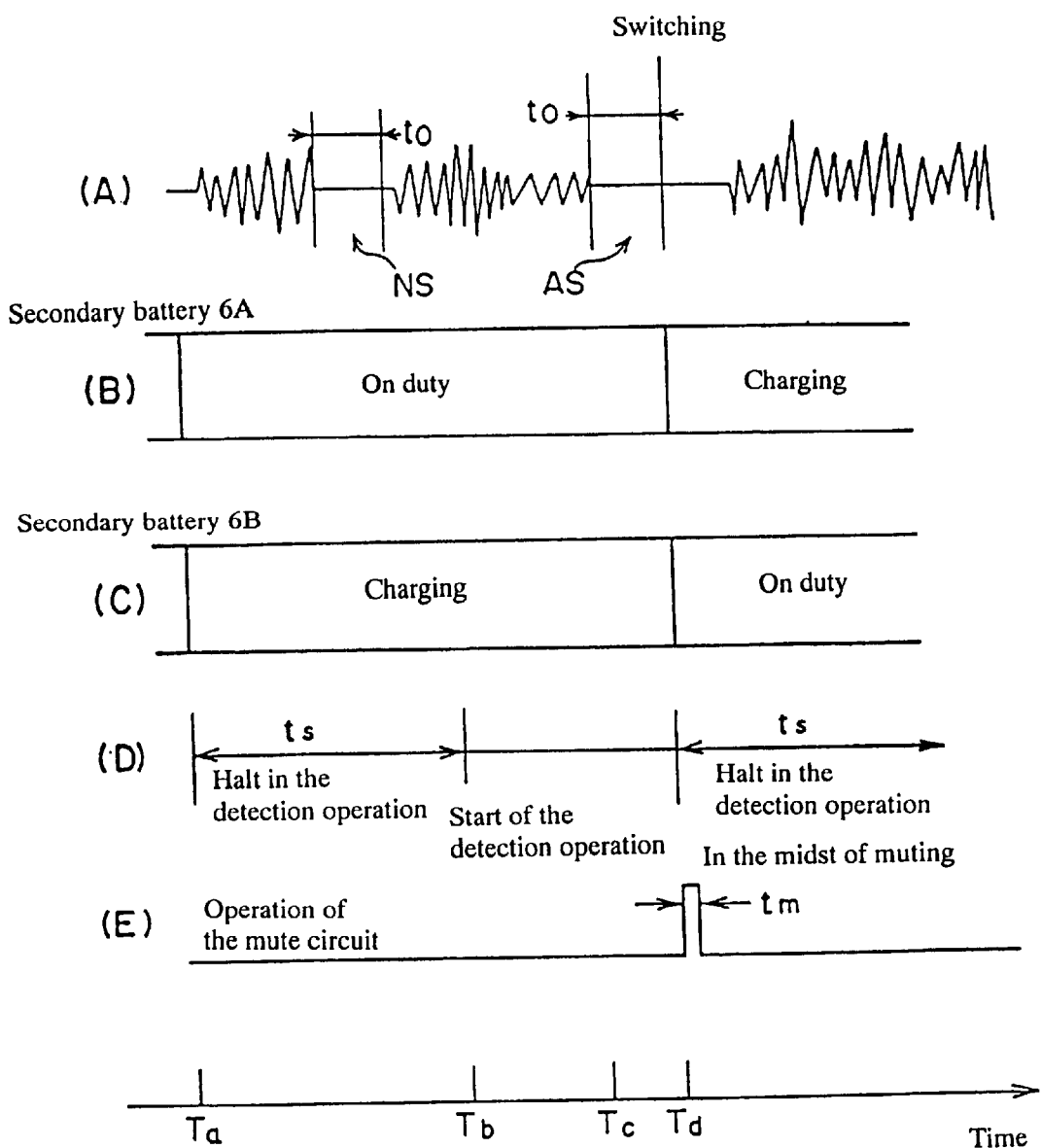
FIG. 2 is a time chart to describe an operation of this power system, etc.

FIG. 2 is a time chart showing the operation of this power system as well as amplification system for audio, and with reference to this FIG. 2 and FIG. 1 already described, the operation of this power system as well as amplification system for audio will be described as follows. For example, now, suppose in the connection switching circuit 7 the moving contacts of the relays 7A and 7B are respectively in contact with the fixed contacts 7A2 and 7B2, and the moving contacts of the relays 7C and 7D are respectively in contact with the fixed contacts 7C2 and 7D2, and consequently the secondary battery 6B is supplying the amplifier for audio 1 with power and the secondary battery 6A is in a state where charging with the charging circuit 8 is taking place. In addition, at the point of time $T_a$ shown in FIG. 2, if a connection switching signal "b" has been sent in from the driving signal generating circuit 5 to the connection switching circuit 7, the respective moving contacts of the relays 7A, 7B, 7C, and 7D will come into contact with fixed contacts different from the fixed contacts with which they used to be in contact until then, and as shown in FIGS. 2(B) and 2(C), the secondary battery 6A will supply the amplifier for audio 1 with power, and the secondary battery 6B will enter the state of undergoing charging.

For example, now, suppose the input signal to the amplifier for audio 1 (equivalent to, that is, the signal to be given to the control circuit 4 via the attenuator 3) is identical to that shown in FIG. 2(A). In this case, the control circuit 4 in FIG. 1 will not, as shown in FIG. 2(D), implement its detecting operation on whether or not any audio signal is contained in the above described given signal, until such a point of time $T_b$ when a predetermined fixed time period $t_s$ has lapsed. Accordingly, though in the case where the portion indicated with the code NS, that is, the audio signal, in FIG. 2(A), does not appear for a fixed time period of to, described later, or longer, the connection switching operation will not be implemented in the connection switching circuit 7. A time period required for completing charging the secondary batteries 6A, 6B is set as the above described fixed time period $t_s$.

After the point of time $T_b$ when the above described fixed time period $t_s$ has lapsed, the above described control circuit 4 proceeds with checking on whether or not the above described given signal contains an audio signal, and in the case where the signal is absent for a fixed time period to or longer as indicated by the code AS shown in FIG. 2(A), the circuit detects this and gives a signal expressing such a state to the driving signal generating circuit 5. Incidentally, the above described fixed time period to is set up so that it is a little shorter than the duration (generally a several seconds) of absence of sounds at the time when, for example, a piece of music is being followed by another piece of music in the case where a CD (Compact Disc) in which a number of pieces of music are recorded is being replayed.

The driving signal generating circuit 5 to which the above described signal has been given by the control circuit 4 firstly sends out a mute instructing signal "a" to the mute circuit 2, and immediately thereafter sends out a connection switching signal "b" to the connection switching circuit 7. The mute circuit 2 to which the mute instruction signal "a" has been given mutes the output from the amplifier for audio 1 for an extremely short time period $t_m$ (see FIG. 2(E)), and during this time period $t_m$, the connection switching circuit 7 which has received the above described connection switching signal "b" implements connection switching and restores the state prior to the point of time $T_a$, and supplies the amplifier for audio 1 with power from the secondary battery 6B and starts charging the secondary battery 6A. And subsequently the above described operation will be repeated. Thus, while one of secondary batteries 6A and 6B is being used as a power for the amplifier for audio 1, the other is arranged to undergo charging, and after this other party has undergone charging sufficiently, when any audio signal is absent for a fixed period of time or longer, the output from the amplifier for audio 1 is muted for an extremely short period of time, during such a period the secondary battery which has been undergoing charging until then is placed on duty as a power for the amplifier for audio 1, and the other party battery starts undergoing charging, which switching operation will be repeated. Thus, no such a case will occur that the amplifying operation of the amplifier for audio 1 must be halted in order to charge the secondary batteries 6A, 6B. Thus availability time period of these two secondary batteries may be comparatively short, and accordingly, the secondary batteries do not have to be large in terms of capacity, and moreover the one with smaller sizes will do.

INDUSTRIAL APPLICABILITY

As described in detail so far, the power system according to the first through fourth inventions does not become very large in terms of sizes in spite of their using secondary batteries, and in addition, after the secondary battery is completely discharged, the supply of DC power will not be halted at the time of charging the battery. Thus, such a power system is useful for a power for electronic facilities which needs the continuous supply of a DC power.

In addition, in the amplification system for audio according to the fifth invention which the power system according to the above described third invention is built in as well as in the amplification system for audio according to the sixth invention, not only the above described effect due to usage of the above described power system, but also such an effect that any occurrence of uncomfortable switching noises from speakers originated in connection switching by a connection switching circuit inside the above described power system can become avoidable can be obtained. Therefore, such an amplification system for audio is useful as the amplifier for various audio appliances.

What is claimed is:

1. A power system for supplying an electronic appliance with DC power characterized by comprising:

a plurality of secondary batteries;

a detecting circuit on absence of signal which detects whether or not there is any input signal into the above described electronic appliance, and in the case when there is no above-described input signal continuously for a predetermined fixed time period, sends out a detecting signal on absence of signal to indicate such a state;

a charging circuit which, after receiving an alternate power, implements the supply of DC power for charging; and a connection switching circuit which connects one of a plurality of said secondary batteries with the above described electronic appliance so that the battery functions a secondary battery for the supply of power to supply said electronic appliance with a DC power, and connects the others with the above described charging circuit so as to function as secondary batteries to be charged, and every time when a detecting signal on absence of a signal is sent out from said detecting circuit on absence of a signal, switches connection status, and causes the one which functioned as said secondary battery for the supply of power up to this point of time to function as said secondary battery to be charged, and causes one of those batteries which functioned said secondary battery to be charged up to said point of time to function as said secondary battery for the supply of power.

2. A power system for supplying an electronic appliance with a DC power characterized by comprising:

a plurality of secondary batteries;

a detecting circuit on absence of signal which, after a predetermined time has lapsed since switching in connection status in the later-described connection switching circuit has taken place, starts detecting whether or not there is any input signal into the above described electronic appliance, and in the case when there is no above-described input signal continuously for a predetermined fixed time period, sends out a detecting signal on absence of signal to indicate such a state;

a charging circuit which, after receiving an alternate power, implements the supply of DC power for charging; and a connection switching circuit which connects one of a plurality of said secondary batteries with the above described electronic appliance so that the battery functions a secondary battery for the supply of power to supply said electronic appliance with a DC power, and connects the others with the above described charging circuit so as to function as secondary batteries to be charged, and every time when a detecting signal on absence of a signal is sent out from said detecting circuit on absence of a signal, switches connection status, and causes the one which functioned as said secondary battery for the supply of power up to this point of time to function as said secondary battery to be charged, and causes one of those batteries which functioned said secondary battery to be charged up to said point of time to function as said secondary battery for the supply of power.

3. A power system for supplying an amplifier for audio with DC power characterized by comprising:

a plurality of secondary batteries;

a detecting circuit on absence of signal which, after a predetermined time has lapsed since switching in connection status in the later-described connection switching circuit has taken place, starts detecting whether or not there is any audio input signal into the above described amplifier for audio, and in the case when there is no said audio input signal continuously for a predetermined fixed time period, sends out a detecting signal on absence of signal to indicate such a state;

a charging circuit which, after receiving an alternate power, implements the supply of DC power for charging; and a connection switching circuit which connects one of a plurality of said secondary batteries with the above described amplifier for audio so that the battery functions a secondary battery for the supply of power to supply said amplifier for audio with a DC power, and connects the others with the above described charging circuit so as to function as batteries to be charged, and every time when a detecting signal on absence of a signal is sent out from said detecting circuit on absence of a signal, switches connection status, and causes the one which functioned as said secondary battery for the supply of power up to this point of time to function as said secondary battery to be charged, and causes one of those batteries which functioned said secondary battery to be charged up to said point of time to function as said secondary battery for the supply of power.

4. The power system according to claim 1, wherein the number of said secondary battery is two.

5. An amplification system for audio characterized by comprising:

the power system according to claim 3;

an amplifier for audio which is provided with the power supply by said power system; and a mute circuit to temporarily mute an output from said amplifier for audio at the time when switching in connection status by a connection switching circuit of said power system takes place.

6. The amplification system for audio according to claim 5, wherein the number of said secondary battery for said power system is two.

* * * * *